United States Patent
Igarashi et al.

(10) Patent No.: US 8,920,666 B2
(45) Date of Patent: Dec. 30, 2014

(54) ETCHING METHOD AND PHOTOMASK BLANK PROCESSING METHOD

(75) Inventors: Shinichi Igarashi, Joetsu (JP); Yukio Inazuki, Joetsu (JP); Hideo Kaneko, Joetsu (JP); Hiroki Yoshikawa, Joetsu (JP); Yoshinori Kinase, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 432 days.

(21) Appl. No.: 12/779,998

(22) Filed: May 14, 2010

(65) Prior Publication Data

US 2010/0291478 A1 Nov. 18, 2010

(30) Foreign Application Priority Data

May 15, 2009 (JP) ................. 2009-118289

(51) Int. Cl.
- *C23F 3/00* (2006.01)
- *G03F 1/26* (2012.01)
- *H01L 21/311* (2006.01)
- *G03F 1/00* (2012.01)
- *G03F 1/80* (2012.01)
- *G03F 1/30* (2012.01)
- *G03F 1/32* (2012.01)

(52) U.S. Cl.
CPC ............ *G03F 1/26* (2013.01); *H01L 21/31116* (2013.01); *H01L 21/31138* (2013.01); *H01L 21/31122* (2013.01); *G03F 1/14* (2013.01); *G03F 1/80* (2013.01); *G03F 1/30* (2013.01); *G03F 1/32* (2013.01)
USPC .................. 216/76; 216/58; 216/79

(58) Field of Classification Search
USPC .......................................... 216/58
See application file for complete search history.

(56) References Cited

U.S. PATENT DOCUMENTS 6,008,135 A 12/1999 Oh et al.
6,037,083 A * 3/2000 Mitsui ............................. 430/5

(Continued)

FOREIGN PATENT DOCUMENTS

EP 1 811 335 A1 7/2007
EP 1 847 874 A2 10/2007

(Continued)

OTHER PUBLICATIONS

Extended European Search Report dated Aug. 21, 2012 issued in corresponding European Patent Application No. 10250913.0.
Japanese Second Office Action dated Sep. 5, 2012 issued in corresponding Japanese patent application No. JP 2009-118289.

\* cited by examiner

*Primary Examiner* — Shamim Ahmed
*Assistant Examiner* — Bradford Gates
(74) *Attorney, Agent, or Firm* — Birch, Stewart, Kolasch & Birch, LLP (57) ABSTRACT

Disclosed herein is a dry etching method for a work layer formed over a substrate, including the steps of forming a hard mask layer over the work layer formed over the substrate, forming a resist pattern over the hard mask layer, transferring the resist pattern to the hard mask layer by first dry etching conducted using the resist pattern, and patterning the work layer by second dry etching conducted using a hard mask pattern obtained upon the transfer to the hard mask layer, wherein after the hard mask layer is patterned by the first dry etching, the patterning of the work layer by the second dry etching is conducted through changing the concentration of an auxiliary ingredient of a dry etching gas, without changing a main ingredient of the dry etching gas, in an etching apparatus in which the first dry etching has been conducted.

12 Claims, 3 Drawing Sheets

(56) References Cited

U.S. PATENT DOCUMENTS

| | | |
|---|---|---|
| 7,625,676 B2 | 12/2009 | Yoshikawa et al. |
| 7,691,546 B2 | 4/2010 | Yoshikawa et al. |
| 2001/0005564 A1* | 6/2001 | Motonaga et al. ............. 430/5 |
| 2006/0057469 A1 | 3/2006 | Kureishi et al. |
| 2006/0088774 A1* | 4/2006 | Yoshikawa et al. ........... 430/5 |
| 2006/0257755 A1* | 11/2006 | Inazuki et al. ............... 430/5 |
| 2007/0190459 A1* | 8/2007 | Hashimoto et al. ...... 430/270.1 |
| 2007/0212618 A1 | 9/2007 | Yoshikawa et al. |
| 2007/0212619 A1 | 9/2007 | Yoshikawa et al. |
| 2008/0139904 A1 | 6/2008 | Colvin et al. |
| 2009/0117474 A1* | 5/2009 | Kominato et al. ............. 430/5 |

FOREIGN PATENT DOCUMENTS

| | | |
|---|---|---|
| JP | 63-085553 A | 4/1988 |
| JP | 11-236686 A | 8/1999 |
| JP | 2000-260749 A | 9/2000 |
| JP | 2001-027799 A | 1/2001 |
| JP | 2006-078807 A | 3/2006 |
| JP | 2006-146152 A | 6/2006 |
| JP | 2007-241060 A | 9/2007 |
| JP | 2007-241065 A | 9/2007 |
| JP | 2007-271774 A | 10/2007 |
| WO | WO 2008/139904 A1 | 11/2008 |

ETCHING METHOD AND PHOTOMASK BLANK PROCESSING METHOD

CROSS-REFERENCE TO RELATED APPLICATION

This non-provisional application claims priority under 35 U.S.C. §119(a) on Patent Application No. 2009-118289 filed in Japan on May 15, 2009, the entire contents of which are hereby incorporated by reference.

TECHNICAL FIELD

The present invention relates to a dry etching method for patterning a work layer (a layer to be processed) formed over a substrate, and to a method of processing a photomask blank, as a blank material for a photomask used for fine processing of a semiconductor integrated circuit, a CCD (charge coupled device), an LCD (liquid crystal display) color filter, a magnetic head or the like, by employing the dry etching method.

BACKGROUND ART

In the field of semiconductor processing in recent years, it has become more and more necessary to achieve miniaturization of circuit patterns, particularly due to the trend toward higher integration densities of LSIs (large scale integrated circuits). As a result, there has been an increasing demand for a technology for reducing the line width of wiring patterns constituting the circuits and for miniaturizing contact hole patterns formed for interlayer wiring in the structure of cells. Accordingly, in the manufacture of a photomask on which a circuit pattern is written and which is used in photolithography for forming the wiring pattern or contact hole pattern, also, a technology by which circuit patterns can be written more finely and accurately is being requested in response to the progress of the miniaturization.

For forming a more accurate photomask pattern on a photomask substrate, first, it is necessary to form a high-accuracy resist pattern on the photomask blank. In photolithography at the time of actual processing of a semiconductor substrate, reduction projection is performed. Therefore, the size of the photomask pattern is about four times the size of the pattern actually needed. However, the accuracy requirement is not loosened that much. Rather, the accuracy required of a photomask used as an original is higher than the accuracy required of a pattern obtained after exposure.

Further, in the lithography carried out at present, the sizes of the circuit patterns to be written are considerably smaller than the wavelength of the light used. If use is made of a photomask pattern formed by simply magnifying the circuit shape by a factor of four, therefore, a shape in exact conformity to the photomask pattern cannot be transferred to a resist film, due to the influences of light interference generated in actual photolithography, etc. In order to reduce these influences, it may in some cases be necessary for the photomask pattern to be processed into a shape which is more complicated than the actual circuit pattern (a shape which is obtained by application of the so-called OPC (Optical Proximity Effect Correction) or the like). Therefore, in the lithographic technology for obtaining a photomask pattern, also, a processing method for yet higher accuracy is being requested at present. The performance of lithography is sometimes represented by the limit resolution. As the resolution limit, a limit resolution accuracy comparable to the resolution limit necessary for photolithography used in a semiconductor processing step using a photomask is demanded for the lithographic technology employed in a photomask processing step.

Formation of a photomask pattern is normally conducted by forming a photoresist film on a photomask blank having a light-shielding film on a transparent substrate, writing a pattern by use of an electron beam, obtaining a resist pattern through development, and then etching the light-shielding film while using the resulting resist pattern as an etching mask, to thereby process the light-shielding film into a light-shielding pattern. In miniaturizing the light-shielding pattern, if it is attempted to carry out the processing while maintaining the thickness of the resist film at the same level as that before miniaturization, the ratio of the film thickness to the pattern, namely, the so-called aspect ratio would become higher. This would cause deterioration of resist pattern shape, making it impossible to achieve satisfactory pattern transfer, or may result in collapse or peeling of the resist pattern. Accordingly, it is necessary to reduce the resist film thickness as miniaturization progresses.

On the other hand, when used as a light-shielding film material, silicon-based materials such as a material containing silicon or a material containing silicon and a transition metal are excellent in light-shielding characteristic for exposure light with a wavelength of 200 nm or below, can be processed by fluorine-based dry etching less liable to damage the resist pattern, and can be processed at higher accuracy, as compared with chromium-based materials which have hitherto been used (JP-A 2007-241065). In addition, it has been found that, when this technology is combined with a technology of using a hard mask formed from a chromium-based material in order to achieve processing with a higher accuracy, it is possible to carry out the processing with a higher precision (JP-A 2007-241060). Accordingly, light-shielding films composed of a silicon-based material film are considered to be promising as a material for a next-generation light-shielding film.

The following references relate to the invention.
JP-A 2007-241065; JP-A 2007-241060; JP-A 2006-146152;
JP-A S63-85553; JP-A 2001-27799; JP-A 2006-078807

SUMMARY OF INVENTION

The dry etching method employing a hard mask technique at the time of dry etching is a method for realizing a high-accuracy processing by utilizing the etching selectivity between a hard mask layer and a work layer (a layer to be processed). Naturally, the conditions for etching of a hard mask layer are different from the etching conditions for the work layer processed by use of the hard mask pattern. In this case, etching gas systems themselves applied respectively to the two etching processes are different. Therefore, it is impractical to continuously etch a hard mask layer and a work layer by switching over the gas species themselves of the different etching gas systems while using the same chamber. In the methods according to the related art, it has been a common practice to carry out the two etching processes by introducing etching gases corresponding respectively to the two layers into different chambers. Therefore, an operation of once taking out an intermediate work from a chamber after the dry etching of the hard mask layer is finished has necessarily been included in the methods according to the related art. However, steps for taking-out from the chamber or movement of the intermediate work increase the possibility of generation of defects, and, accordingly, it is preferable that the number of these steps is as small as possible.

The present invention has been made in order to solve the above-mentioned problem. Accordingly, it is an object of the present invention to provide an etching method which makes it possible to carry out dry etching of a multilayer film, composed of a hard mask layer and a work layer having etching selectivity in relation to the hard mask layer, in the same chamber and in a continuous manner while employing a hard mask technology, and to provide a photomask blank processing method based on application of the etching method.

Examples of light-shielding film materials for forming a photomask which have hitherto been proposed include: metallic or metal compound materials, for example, transition metals such as chromium, tantalum, etc. and transition metal compounds containing at least one of these transition metals and a light element such as oxygen, nitrogen, carbon, etc.; and silicon-based materials, for example, silicon or metal-silicon compounds, and compounds containing at least one of these silicon or silicon-metal compounds and a light element such as oxygen, nitrogen, carbon, etc. Typical examples of a method or conditions for dry etching of such a light-shielding film material include fluorine-based dry etching in which a fluorine-containing compound gas is used, and chlorine-based dry etching in which chlorine or a chlorine-containing compound gas is employed.

In introducing the hard mask technology, different material systems have been selected as materials for a work layer and a hard mask layer. For instance, a chromium-based material or the like which is durable to fluorine-based dry etching is used for the hard mask layer in the case where the work layer is a layer capable of being etched by fluorine-based dry etching, such as silicon or metal-silicon compound materials, as described in JP-A 2007-241060. Besides, silicon or a metal-silicon material or the like which is durable to oxygen-containing chlorine-based dry etching is used for the hard mask layer in the case where the work layer is a layer capable of being etched by oxygen-containing chlorine-based dry etching, such as chromium-based materials, as described in JP-A 2006-146152.

On the other hand, JP-A S63-85553 discloses that in processing a molybdenum silicide light-shielding film, silicon oxide ($Si_mO_n$) close to molybdenum silicide on the basis of material system can be used as a hard mask material. In this case, after the hard mask film is processed by fluorine-based dry etching, the molybdenum silicide light-shielding film is processed by chlorine-based dry etching while using the etched silicon oxide layer as a hard mask.

Besides, in processing of a halftone phase shift film shown in JP-A 2001-27799, it is shown that, though the composition is unclear, a MoSiON film can be etched within a quite wide range of oxygen content under oxygen-containing chlorine-based dry etching conditions. This indicates that the MoSiON film can be etched under oxygen-containing chlorine-based dry etching conditions and, at the same time, suggests that it is difficult to obtain satisfactory selectivity between different MoSiON films.

In order to attain the above object, the present inventors made intensive and extensive investigations; specifically, they made re-investigations about selective etching of silicon-based materials which contain a transition metal. As a result, the present inventors found out that in the case where a difference in oxygen and nitrogen contents exists between two kinds of silicon compound materials which contain a transition metal, the material lower in total content of oxygen and nitrogen can be selectively etched by employing oxygen-containing chlorine-based dry etching and controlling the quantity of oxygen contained in the etching gas.

Further, the present inventors found out that the just-mentioned selective etching method is effective in etching a laminate film such as a light-shielding film composed of laminated two silicon material layers which may contain a transition metal and which differ from each other in oxygen and/or nitrogen content. Specifically, it was found out that, in the case where the laminate film includes a film having a higher oxygen and/or nitrogen content as an upper layer and a film having a lower oxygen and/or nitrogen content as a lower layer, the following method may be adopted. In the method, the upper layer is etched by dry etching in a chlorine-based gas containing oxygen at a level which is not more than a limit concentration relevant to effective etching rate of the upper layer and at which the lower layer is not substantially etched. Then, upon completion of the etching of the upper layer, the oxygen content of the etching gas is increased to a concentration at which an effective etching rate of the lower layer is attained, whereby the lower layer can be etched while employing the etched upper layer pattern as an etching mask. Based on these findings, the present invention has been made.

Thus, according to the present invention, there are provided an etching method and a photomask blank processing method as follows.

According to an embodiment of the present invention, there is provided a dry etching method for a work layer formed over a substrate, including the steps of forming a hard mask layer over the work layer formed over the substrate, forming a resist pattern over the hard mask layer, transferring the resist pattern to the hard mask layer by first dry etching conducted using the resist pattern, and patterning the work layer by second dry etching conducted using a hard mask pattern obtained upon the transfer to the hard mask layer, wherein after the hard mask layer is patterned by the first dry etching, the patterning of the work layer by the second dry etching is conducted through changing the concentration of an auxiliary ingredient of a dry etching gas, without changing a main ingredient of the dry etching gas, in an etching apparatus in which the first dry etching has been conducted.

In the dry etching method as above, preferably, the hard mask layer is a layer of a silicon-based material which contains oxygen and/or nitrogen and which may contain a transition metal;

the work layer is a layer of a silicon-based material which may contain a transition metal and which is lower than the hard mask layer in total content of oxygen and nitrogen;

the main ingredient of the dry etching gas is a chlorine-based gas; and the auxiliary ingredient of the dry etching gas is an oxygen gas.

According to another embodiment of the present invention, there is provided a photomask blank processing method which includes processing an optical film of a photomask blank by use of the dry etching method according to an embodiment of the present invention.

In the photomask blank processing method as above, preferably, the optical film is a light-shielding film, and the light-shielding film includes the hard mask layer as an upper layer and the work layer as a lower layer.

In the photomask blank processing method as above, preferably, the upper layer is formed by reactive sputtering, and a reactive gas during the formation of the upper layer is controlled so that the upper layer will be higher than the lower layer in total content of oxygen and nitrogen.

In the photomask blank processing method as above, preferably, the upper layer is formed by subjecting a face-side part of the light-shielding film to an oxidizing treatment so that the upper layer will be higher than the lower layer constituting a remaining part of the light-shielding layer in total content of oxygen and nitrogen.

In the photomask blank processing method as above, preferably, a photomask blank in which the difference ($C_1-C_2$) between the total content $C_1$ (mol %) of nitrogen and oxygen in a material constituting the upper layer and the total content $C_2$ (mol %) of nitrogen and oxygen in a material constituting the lower layer is not less than 5 is used; and chlorine-based dry etching in which the quantitative ratio ((oxygen gas)/(chlorine-based gas) (molar ratio)) between a chlorine-based gas and an oxygen gas in the second dry etching is set in the range of from 0.001 to 1 is conducted.

In the photomask blank processing method as above, preferably, the silicon-based material which may contain a transition metal and which is lower than the hard mask layer in total content of oxygen and nitrogen, of the work layer, is either a silicon-based material which contains oxygen and/or nitrogen and which may contain a transition metal or a silicon-based material which may contain a transition metal and which contains neither oxygen nor nitrogen.

In the photomask blank processing method as above, preferably, the transition metal is at least one selected from the group consisting of titanium, vanadium, cobalt, nickel, zirconium, niobium, molybdenum, hafnium, tantalum and tungsten.

Advantageous Effects of Invention

In the dry etching method according to an embodiment of the present invention, in patterning of a laminate film having an etching mask layer and a work layer to be processed using the etching mask layer as a mask, for example, a light-shielding film in a photomask blank, dry etching of the laminate film such as the light-shielding film can be carried out by a dry etching method in the same chamber while employing a hard mask technology which enables high-accuracy etching. Besides, according to the dry etching method, it is possible to provide a photomask blank processing method by which possibility of generation of defects, in manufacturing a photomask from a photomask blank, is suppressed.

DESCRIPTION OF EMBODIMENTS

In the manufacture of a photomask, for processing a light-shielding film formed over a transparent substrate, a resist pattern of an organic film having a comparatively high carbon content such as a film of a resin having an aromatic structure is formed on the light-shielding film, and the light-shielding film (which is formed from an inorganic material) is etched by using the resist pattern as an etching mask. Particularly, in order to form a light-shielding part in a fine pattern as demanded at present, processing by anisotropic etching is employed.

A photomask to be used for fine processing by photolithography, as in the manufacture of a semiconductor device or the like, is demanded to have a fine and highly accurate light-shielding pattern. As the resist film for forming such a fine light-shielding pattern, a thinner film is used as the pattern becomes finer, in view of the aspect ratio or the like problems mentioned above. In addition, as a resist pattern, those which are high in verticalness of side walls are used preferably. However, as the dry etching proceeds, the resist pattern recedes gradually by being cut from end portions thereof, irrespectively of whether the dry etching is a chlorine-based dry etching or a fluorine-based dry etching. Therefore, as the resist film used in this process becomes thinner, the problem of dimensional errors between the resist pattern and the light-shielding film processed by use of the resist pattern becomes more conspicuous.

As a method for suppressing the dimensional errors arising from the recession of the resist pattern during dry etching, there is known a method in which a hard mask is used. In the method in which a hard mask is used, a resist pattern is once transferred to a thin film sufficiently durable to etching under the dry etching conditions for a work film, and the work film is etched by using the thus obtained hard mask pattern as an etching mask. In this method, it suffices for the resist pattern to be transferred only to the hard mask film with high accuracy. As a result, the load on the resist pattern during the etching is considerably lowered, as compared with the case where the light-shielding film as a whole is etched by use of the resist pattern. The method in which a hard mask is used is applicable also to mask processing, as shown by application examples described in JP-A 2007-241060 and JP-A S63-85553.

In the method of etching a work film by use of a hard mask according to the related art, however, as in either case, the etching conditions for etching the hard mask and the etching conditions for etching the work film have been established by selective use of a fluorine-based dry etching gas and a chlorine-based dry etching gas which may contain oxygen, if necessary.

On the other hand, in dry etching for performing precision processing, the environment inside an etching apparatus is controlled rigorously for controlling strictly the etching rate and the like. Therefore, in the case where different etching gas systems are used for the dry etching steps, it has been a common practice to use different etching chambers. Meanwhile, even where basically the same apparatus is used for the dry etching steps, it is possible to use different etching gases for the dry etching steps by changing over the etching gas. However, for controlling strictly the etching conditions as above-mentioned, it is needed to take a long equilibration time necessary for gas replacement. Further, even when a long equilibration time is taken, generation of dust particles cannot be obviated in the case where the gas system is changed over without cleaning the inside of the chamber.

In the dry etching method according to an embodiment of the present invention, the work layer formed over a substrate is etched by use of a hard mask layer. In this dry etching method, the hard mask layer is formed on the work layer formed over the substrate, a resist pattern is formed on the hard mask layer, the resist pattern is transferred to the hard mask layer by first dry etching conducted using the resist pattern, and the work layer is patterned by second dry etching conducted using the hard mask pattern obtained upon the transfer to the hard mask layer. Besides, after the hard mask layer is patterned by the first dry etching, the work layer is patterned by the second dry etching through changing the concentration of an auxiliary ingredient of the dry etching gas, without changing a main ingredient of the dry etching gas, in the etching apparatus in which the first dry etching has been carried out.

In the case where the main ingredient of the etching gas for dry etching of the hard mask layer and that for dry etching of the work layer are the same as each other, as in the present invention, the etching conditions can be switched over by the presence or absence of the auxiliary ingredient or by an increase or decrease in the proportion of the auxiliary ingredient. In this case, consequently, the etching steps can be carried out continuously in the same apparatus.

In the dry etching method as above, preferably, the hard mask layer is a layer of a silicon-based material which contains oxygen and/or nitrogen and which may contain a transition metal. Besides, the work layer is preferably a layer of a silicon-based material which may contain a transition metal and which is lower than the hard mask layer in total content of oxygen and nitrogen.

Furthermore, in the case of the above-mentioned combination of the hard mask layer and the work layer, preferably, the dry etching gas contains a chlorine-based gas as the main ingredient and an oxygen gas as the auxiliary ingredient.

Effective application examples of the etching method in which processing of a hard mask layer and processing of a work layer are continuously carried out in the same etching apparatus without changing the main etching gas component as above-mentioned include a method of processing an optical film of a photomask blank as follows.

The present inventors produced various test samples, made review of the etching selectivity roughly grasped in the past, and made investigations on variations in the selectively ratio with various variations in etching conditions and compositions. As a result, the present inventors found out that, by appropriately selecting the contents of oxygen and nitrogen in a silicon-based material which may contain a transition metal, and by appropriately controlling the amount of oxygen added to the chlorine-based dry etching gas, it is possible to achieve selective etching, through only chlorine-based dry etching, between silicon-based material layers which may contain a transition metal and which are different from each other in the oxygen and/or nitrogen content.

This etching selectivity is applicable to hard mask technology in the following manner. For example, a multilayer light-shielding film composed of silicon-based material layers which have different compositions and which may contain a transition metal is formed (incidentally, in the present invention, a film having a layer configuration with an inclined composition, for example, a film in which the oxygen concentration gradually decreases along the depth direction, is also included in the multilayer film). In the multilayer light-shielding film, the upper layer (on the face layer side) is a layer having a high total content of oxygen and nitrogen. The upper layer is processed by dry etching conducted using a chlorine-based etching gas which does not contain oxygen or which has a low oxygen content. Thereafter, the oxygen content is increased, and etching is conducted in chlorine-based dry etching conditions in which the ability to etch the upper layer is thus suppressed. In this manner, the silicon-based material layer which may contain a transition metal, which is the lower layer (on the substrate side) as the work layer and which is low in total content of oxygen and nitrogen can be processed while using the upper layer as the etching mask layer.

The light-shielding film possessed by the photomask blank for use in the photomask blank processing method, which is a suitable application example of the present invention, may be one in which a light-shielding film is formed directly on a transparent substrate and which is used as a binary mask, or one in which a light-shielding film is formed on a halftone phase shift film and which is used as a phase shift mask. Where the light-shielding film is one for use as a binary mask, the optical density of the light-shielding film as a whole is preferably in the range of from 2 to 4, more preferably 2.5 to 4. On the other hand, where the light-shielding film is one for use on a halftone phase shift film, the overall optical density of the combination of the light-shielding film and the halftone phase shift film is preferably in the range of from 2 to 4, more preferably 2.5 to 4.

The light-shielding film possessed by the photomask blank, preferably, includes an upper layer and a lower layer. Each of the upper layer and the lower layer may have a monolayer structure or a multilayer structure, and, further, a composition transition region may be present between the upper layer and the lower layer. In addition, each of the upper layer and the lower layer is preferably formed of a silicon-based material which may contain a transition metal. The silicon-based material constituting the upper layer must contain oxygen and/or nitrogen; on the other hand, the silicon-based material constituting the lower layer may contain oxygen and/or nitrogen or may contain neither oxygen nor nitrogen.

Between the upper layer and the lower layer, a sufficient difference in total content of oxygen and nitrogen must be provided for obtaining etching selectivity in oxygen-containing chlorine-based dry etching. The difference $(C_1-C_2)$ between the total content $C_1$ (mol %) of nitrogen and oxygen in the upper layer and the total content $C_2$ (mol %) of nitrogen and oxygen in the lower layer is preferably not less than 5, more preferably not less than 10, and further preferably not less than 20. By setting the total content of oxygen and nitrogen at a high value, the upper layer can be made to function as a layer having an antireflection function in the light-shielding film or as a layer in charge of part of the antireflection function.

Besides, in the case where the light-shielding film is for use as a binary mask for an ArF excimer laser, the thickness of the light-shielding film is about 30 to 100 nm. Though depending on the selection of materials for the upper layer and the lower layer, the thickness of the upper layer is preferably set in the range of from 0.5 to 20 nm, more preferably from 1.0 to 10 nm, and further preferably from 1.0 to 5 nm, whereby more precise processing can be carried out.

The transition element in the present invention, particularly, the transition metal contained in the light-shielding film, is preferably at least one material selected from the group consisting of titanium, vanadium, cobalt, nickel, zirconium, niobium, molybdenum, hafnium, tantalum and tungsten, with molybdenum being especially preferred from the viewpoint of dry-etching processability. As for the content of the transition element, it suffices for the content to be at such a level as to ensure that dust particles are not generated during formation of the film by sputtering, and is preferably set in the range of from 1 to 50 at % (atomic percent) to silicon atom.

As for the contents of the elements in the light-shielding film, the content of silicon is preferably 10 to 95 at %, particularly 30 to 95 at %; the content of oxygen is preferably 0 to 50 at %, particularly 0 to 30 at %; the content of nitrogen is preferably 0 to 40 at %, particularly 0 to 20 at %; the content of carbon is preferably 0 to 20 at %, particularly 0 to 5 at %; and the content of the transition metal is preferably 0 to 35 at %, particularly 1 to 20 at %. In this case, as above-mentioned, the contents of the materials are so selected that a difference in total content of oxygen and nitrogen will be present between the upper layer and the lower layer.

Each of the silicon-based material layers which constitute the upper layer and the lower layer and which may contain a transition metal can be formed, for example, by reactive sputtering which has been known (as described, for example, in JP-A 2007-241065, JP-A 2007-241060, and JP-A 2006-146152). Besides, the total content of oxygen and nitrogen in each layer can be controlled by selecting the kinds and quantities of the oxygen- and/or nitrogen-containing reactive gases used at the time of forming the layer.

In addition, examples of another control method include a method in which a face-side part of the light-shielding film is subjected to an oxidizing treatment using an ozone gas, an oxygen plasma, an aqueous ozone solution, an aqueous hydrogen peroxide solution or the like, thereby forming the upper layer, which is higher than the remaining layer, or the lower layer, in total content of oxygen and nitrogen. In this case, the oxidizing treatment can be conducted after the formation of the whole layer which will constitute the light-shielding layer.

The selective etching conditions for the upper layer and the lower layer in carrying out the oxygen-containing chlorine-based dry etching employed in the present invention can be determined, for example, by the following method.

First, a film of a silicon-based material which may contain a transition metal and which has a composition suitable as a candidate material for the upper layer and the lower layer is formed in a predetermined quantity on a substrate such as a quartz substrate to be used as a photomask substrate. The film is subjected to dry etching in a chlorine-based gas having a predetermined oxygen gas content (a predetermined ratio of oxygen gas and chlorine-based gas) a number of times while changing the oxygen gas content (changing the quantitative ratio of the oxygen gas and the chlorine-based gas), and the etching clearing times of the dry etching steps are determined, whereby etching ratio as a function of oxygen addition amount is obtained.

The etching clearing time can be determined by measuring the reflectance of the film of the silicon-based material containing the transition metal during the etching. In addition, the etching clearing time can be determined by a visually checking method in the case where the film of the silicon-based material can be observed during etching. Further, the etching clearing time may be determined using, for example, a method based on analysis of an ion or element in a plasma in the etching chamber through analysis of, for example, emission spectrum of the plasma. In addition, the etching rate can be determined not by the etching clearing time but by a method in which the thickness of film removed by etching is measured by a probe-type film thickness meter or transmittance or an optical method such as ellipsometry, after part of the silicon-based material is masked and etching is conducted for a predetermined time. These methods may be applied in combination.

In this manner, the etching rates of the film materials which are different in total content of oxygen and nitrogen and which are candidate materials for the upper layer and the lower layer when the content ratio of chlorine and oxygen in the etching gas is varied are determined. With these etching rates obtained, the etching conditions for etching of the upper layer by use of the resist pattern as an etching mask as the first dry etching (first stage) and the etching conditions for etching of the lower layer, specifically etching of only the lower layer without etching the upper layer, by use of the etched upper layer as an etching mask as the second dry etching (second stage) can both be found out.

The oxygen-containing chlorine-based dry etching employed here can be carried out by using a chlorine gas ($Cl_2$) or the like and, typically, under general dry etching conditions employed for etching of the chromium-based material film of the photomask blank, while regulating the oxygen addition amount (regulating the ratio of oxygen gas and chlorine-based gas).

Specifically, it suffices that the ratio between the chlorine-based gas and the oxygen gas (molar ratio of (oxygen gas)/(chlorine-based gas)) in the first dry etching is 0 (the value of 0 corresponds to the case of using only the chlorine-based gas and not using the oxygen gas) or more; preferably, the ratio is not more than 1, more preferably not more than 0.5, and further preferably not more than 0.1. On the other hand, the ratio between the chlorine-based gas and the oxygen gas (molar ratio of (oxygen gas)/(chlorine-based gas)) in the second dry etching is preferably not less than 0.001, more preferably not less than 0.005, and further preferably not less than 0.01, and is preferably not more than 1, more preferably not more than 0.5, and further preferably not more than 0.3, with the molar ratio in the second dry etching having to be higher than that in the first dry etching.

More specifically, for example, such conditions as a chlorine gas flow rate of 100 to 300 sccm, an oxygen gas flow rate of 0 to 100 sccm, and a gas pressure of 1 to 10 mTorr may be applied. Besides, a helium gas may be added in a quantity of 1 to 20 sccm.

In the present invention, when a difference in total content of oxygen and nitrogen in film is present between the two layers of silicon-based materials in mutual contact (when the total content of nitrogen and oxygen in the lower layer is set to be lower than the total content of nitrogen and oxygen in the upper layer), etching selectivity can be obtained using the above-mentioned chlorine-based dry etching steps. As above-mentioned, when the difference ($C_1-C_2$) between the total content $C_1$ (mol %) of nitrogen and oxygen in the upper layer and the total content $C_2$ (mol %) of nitrogen and oxygen in the lower layer is not less then 5, preferably not less than 10, and more preferably not less than 20, it is possible, by controlling the oxygen addition amount to an appropriate level by the above-mentioned method, to make the etching rate of the lower layer higher than the etching rate of the upper layer, particularly, to obtain an etching rate difference by the factor of 10 or more, that is, to obtain an etching rate difference sufficient for obtaining selectivity.

The photomask blank processing process in the photomask blank processing method according to an embodiment of the present invention can be carried out as follows.

First, a resist film is formed on the above-mentioned photomask blank, followed by pattern exposure using a high-energy beam such as an electron beam, to obtain a resist pattern. This step of obtaining the resist pattern may be carried out by any method that ensures that the resist pattern shows preferable durability and a high resolution can be obtained. In the method according to an embodiment of the present invention, etching can be conducted using a resist film having a thickness of 150 nm or below, and, further, processing with a preferable accuracy can be carried out using a resist film having a thickness of 100 nm or below.

Next, the resist pattern is transferred to the upper layer by the first dry etching. As has been described above, this transfer is carried out by applying the chlorine-based dry etching conditions in which the oxygen content ratio is lower than that in the second dry etching conditions. In this etching, complete removal of only the upper layer by etching suffices, but part (upper portion) of the lower layer may also be etched away. Besides, in the case where a composition transition portion is present between the upper layer and the lower layer, it suffices for the etching to reach such a depth that a portion promising a sufficient difference in total content of oxygen and nitrogen is exposed. Therefore, the etching time for the first dry etching can be set at a value of preferably 1 to 3 times, more preferably 1.2 to 2 times, a theoretical etching time which is determined by the etching rate, possessed by the material of the upper layer in the etching conditions for the upper layer, and the thickness of the upper layer.

Further, after the first dry etching is finished, the oxygen content of the etching gas is subsequently increased, and the second dry etching employing an oxygen content preliminarily set by the above-mentioned method is carried out. In the second dry etching, the pattern of the upper layer obtained by the first dry etching is little etched. Therefore, the upper layer functions as a hard mask. Accordingly, even in the case where part of end portions of the resist film starts receding under the dry etching conditions, it is possible to realize a high-accuracy pattern transfer to the lower layer. Consequently, the laminate film such as the light-shielding film composed of the upper layer and the lower layer can be processed by etching with high accuracy.

EXAMPLES

Now, the present invention will be described below specifically by showing Experimental Examples and Example, but the invention is not to be construed as limited to the following Example.

Experimental Example 1

Figure 1:
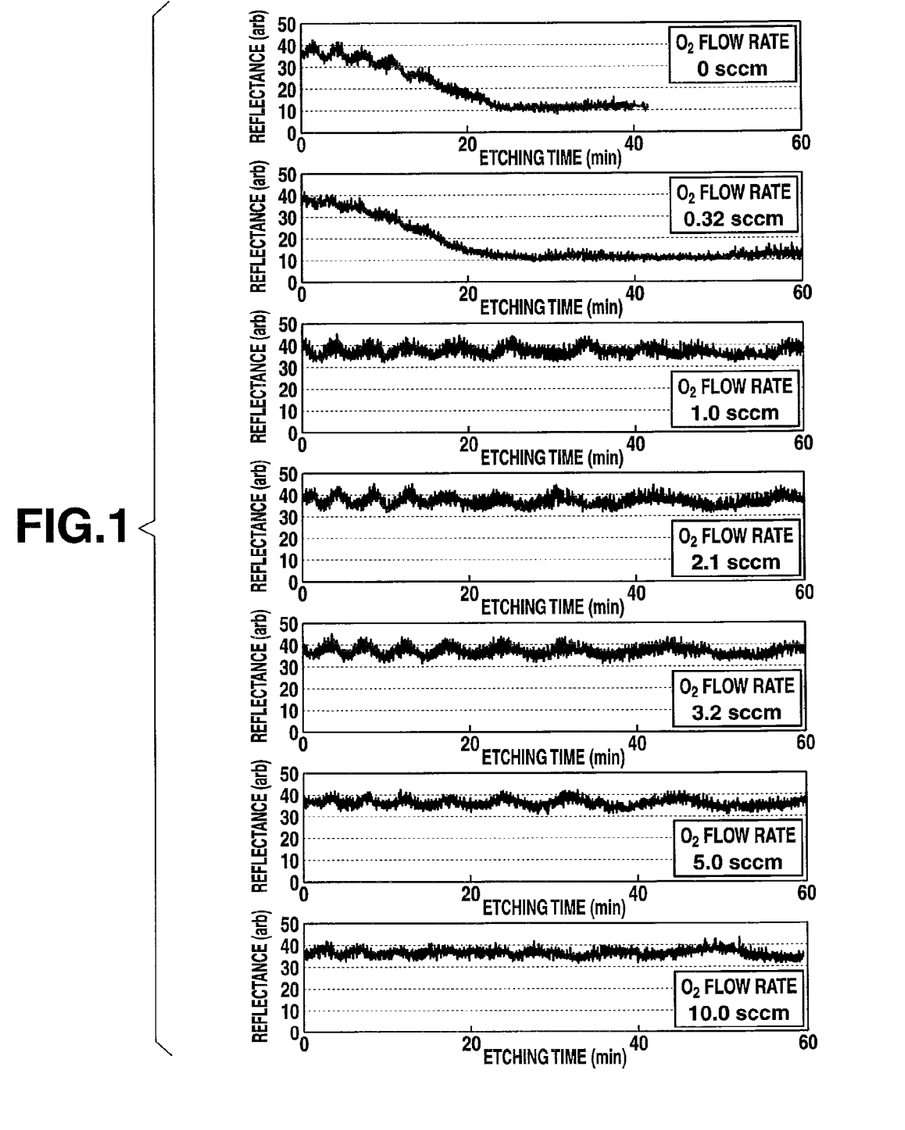
FIG. 1 shows graphs showing variations in reflectance of a film with etching time, measured by changing $O_2$ flow rate in Experimental Example 1.
Figure 3:
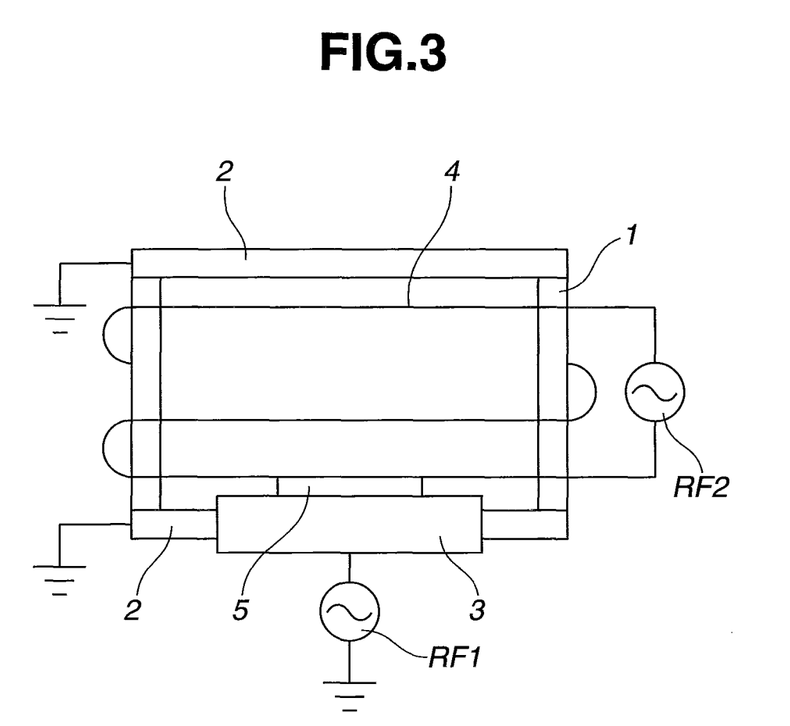
FIG. 3 is a schematic illustration of a dry etching apparatus used in Experimental Examples and Example.

By using a 75 nm-thick film of a silicon-based material MoSiON (Mo:Si:O:N=1:4:1:4 (molar ratio), with total content of oxygen and nitrogen being 50 mol %) formed on a quartz substrate, the quantity of oxygen in an etching gas and etching rate under chlorine-based dry etching conditions were evaluated. For the evaluation, the quantity (flow rate) of oxygen was varied in the range of from 0 to 10.0 sccm under the following conditions, and variation in reflectance for a test beam having a wavelength of 675 nm with time was measured. The results are shown in FIG. 1. Incidentally, the etching apparatus used is schematically illustrated in FIG. 3, in which reference symbol 1 denotes a chamber, 2 an earth, 3 a lower electrode, 4 an antenna coil, 5 a substrate to be treated, and symbols RF1 and RF2 denote high-frequency power supplies.

RF1 (RIE: Reactive Ion Etching): pulse 700 V
RF2 (ICP: Inductively Coupled Plasma): CW (continuous discharge) 400 W
Pressure: 6 mTorr
$Cl_2$: 185 sccm
$O_2$: 0 to 10.0 scorn
He: 9.25 sccm From the variations in reflectance with dry etching time shown in FIG. 1, it is seen that while the reflectance of the film surface before etching is about 40, the reflectance is lowered as the etching proceeds, and the reflectance becomes about 10 when the etching of the film is finished. It is also seen that the MoSiON film having a total content of oxygen and nitrogen of 50 mol % which is used here is little etched when the quantity (flow rate) of oxygen in the atmosphere gas in the dry etching is set to be not less than 1 sccm (when the molar ratio of (oxygen gas)/(chlorine gas) is set to be not less than 1/185).

Experimental Example 2

By using a 46 nm-thick film of a silicon-based material MoSiN (Mo:Si:N=1:3:1.5 (molar ratio), with the total content of oxygen and nitrogen being 27 mol %), variation of reflectance with time was measured in the same manner as in Experimental Example 1. The results are shown in FIG. 2.

Figure 2:
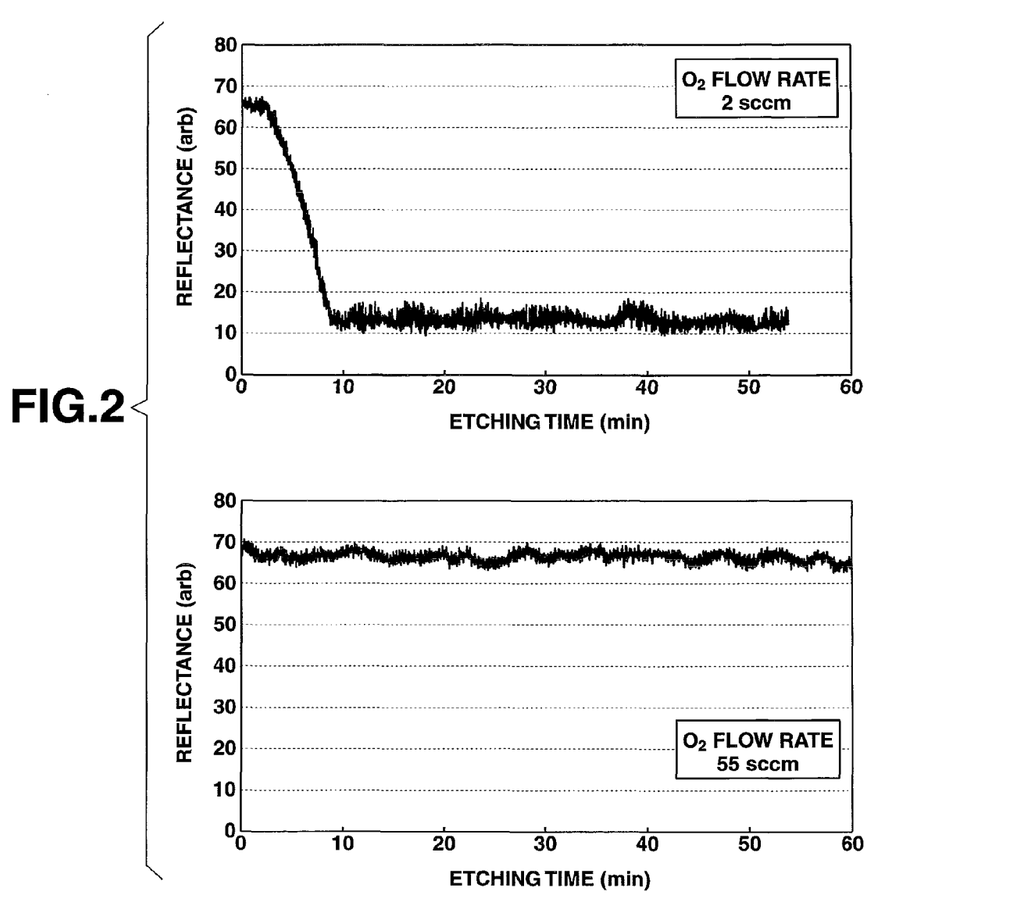
FIG. 2 shows graphs showing variations in reflectance of a film with etching time, measured by changing $O_2$ flow rate in Experimental Example 2.

As shown in FIG. 2, it was confirmed that when the quantity (flow rate) of oxygen in the atmosphere gas in the dry etching is set at 2 sccm (when the molar ratio of (oxygen gas)/(chlorine gas) is set at 2/185), the film was etched at a rate of about 5 nm/min, whereas when the quantity (flow rate) of oxygen in the atmosphere gas is set at 55 sccm (when the molar ratio of (oxygen gas)/(chlorine gas) is set at 55/185), etching of the film does not proceed at all.

Example 1

A photomask blank having a light-shielding film formed on a quartz substrate was prepared. The light-shielding film had a lower layer (work layer) composed of a 50 nm-thick film of MoSiN (Mo:Si:N=1:3:1.5 (molar ratio), with the total content of oxygen and nitrogen being about 27%) and an upper layer (hard mask layer) thereon composed of a 10 nm-thick film of MoSiON (Mo:Si:O:N=1:4:1:4 (molar ratio), with the total content of oxygen and nitrogen being about 50%). A 150 nm-thick chemically amplified resist film for EB exposure was formed on the photomask blank by use of a spin coater. After a pattern was written on the resist film by an EB exposure apparatus, development is conducted, to form a resist pattern for protecting the areas where the light-shielding film is left.

Next, using the resist mask as an etching mask, etching was carried out by chlorine-based dry etching under the following Etching Conditions 1 in which the upper layer is etched and which was obtained in Experimental Example 1 above.

[Etching Conditions 1]
RF1 (RIE): pulse 700 W
RF2 (ICP): CW 400 W
Pressure: 6 mTorr
$Cl_2$: 185 sccm
$O_2$: 0 sccm
He: 9.25 sccm After the film was etched under Etching Conditions 1 for four minutes, oxygen was added in a quantity (flow rate) of 2 sccm, for obtaining etching conditions in which the lower layer can be etched without etching the upper layer. In the following Etching Conditions 2 thus obtained, dry etching was further continued for 15 minutes. As a result, it was possible to process the light-shielding film into a predetermined pattern by a single run of etching.

[Etching Conditions 2]
RF1 (RIE): pulse 700 W
RF2 (ICP): CW 400 W
Pressure: 6 mTorr
$Cl_2$: 185 sccm
$O_2$: 2 sccm
He: 9.25 sccm Japanese Patent Application No. 2009-118289 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A dry etching method for a work layer as a lower layer formed over a substrate, comprising the steps of:
    forming a hard mask layer as an upper layer over the work layer formed over the substrate, forming a resist pattern over the hard mask layer, transferring the resist pattern to the hard mask layer by first dry etching conducted using the resist pattern, and patterning the work layer by second dry etching conducted using a hard mask pattern obtained upon the transfer to the hard mask layer, wherein the hard mask layer is a layer of a silicon-based material which consists of oxygen and/or nitrogen, silicon, and at least one transition metal selected from the group consisting of titanium, vanadium, cobalt, nickel, zirconium, niobium, molybdenum, hafnium, tantalum, and tungsten; and the work layer is a layer of a silicon-based material which consists of silicon and at least one transition metal selected from the group consisting of titanium, vanadium, cobalt, nickel, zirconium, niobium, molybdenum, hafnium, tantalum, and tungsten or a layer of a silicon-based material which consists of oxygen and/or nitrogen, silicon, and at least one transition metal selected from the group consisting of titanium, vanadium, cobalt, nickel, zirconium, niobium, molybdenum, hafnium, tantalum, and tungsten and which is lower than the hard mask layer in total mole percent of oxygen and nitrogen, and after the hard mask layer is patterned by the first dry etching in an etching apparatus, the patterning of the work layer by the second dry etching is continuously conducted with the first dry etching through changing the concentration of an oxygen gas as an auxiliary ingredient of a dry etching gas, without changing a chlorine-based gas as a main ingredient of the dry etching gas, in the same etching apparatus in which the first dry etching has been conducted.

2. A photomask blank processing method comprising processing an optical film of a photomask blank by use of the dry etching method according to claim 1.

3. The photomask blank processing method according to claim 2, wherein the optical film is a light-shielding film, and the light-shielding film comprises the hard mask layer as an upper layer and the work layer as a lower layer.

4. The photomask blank processing method according to claim 3, wherein the upper layer is formed by reactive sputtering, and a reactive gas during the formation of the upper layer is controlled so that the upper layer will be higher than the lower layer in total mole percent of oxygen and nitrogen.

5. The photomask blank processing method according to claim 3, wherein the upper layer is formed by subjecting a part of an upper side of the light-shielding film to an oxidizing treatment so that the upper layer will be higher than the lower layer constituting a remaining part of the light-shielding layer in total mole percent of oxygen and nitrogen.

6. The photomask blank processing method according to claim 3, wherein a content of silicon of the light-shielding film is 10 to 95 at % and a content of the transition metal of the light-shielding film is 1 to 35 at %.

7. The photomask blank processing method according to claim 2, wherein a photomask blank in which the difference ($C_1-C_2$) between the total content $C_1$ (mol %) of nitrogen and oxygen in a material constituting the upper layer and the total content $C_2$ (mol %) of nitrogen and oxygen in a material constituting the lower layer is not less than 5 is used; and chlorine-based dry etching in which the quantitative ratio ((oxygen gas)/(chlorine-based gas) (molar ratio)) between a chlorine-based gas and an oxygen gas in the second dry etching is set in the range of from 0.001 to 1 is conducted.

8. The photomask blank processing method according to claim 2, wherein the silicon-based material of the work layer is either a silicon-based material which contains oxygen and/or nitrogen and a transition metal or a silicon-based material which contains a transition metal and which contains neither oxygen nor nitrogen.

9. The photomask blank processing method according to claim 2, wherein both of the transition metals of the hard mask layer and the work layer are molybdenum.

10. The photomask blank processing method according to claim 2, wherein both of the transition metals of the hard mask layer and the work layer independently comprise at least one selected from the group consisting of titanium, vanadium, cobalt, nickel, zirconium, niobium, molybdenum, hafnium, and tungsten.

11. The dry etching method according to claim 1, wherein both of the transition metals of the hard mask layer and the work layer are molybdenum.

12. The dry etching method according to claim 1, wherein both of the transition metals of the hard mask layer and the work layer independently comprise at least one selected from the group consisting of titanium, vanadium, cobalt, nickel, zirconium, niobium, molybdenum, hafnium, and tungsten.

* * * * *